(12) United States Patent
Waz

(10) Patent No.: US 12,713,550 B2
(45) Date of Patent: Aug. 18, 2026

(54) EQUIPMENT RAIL WITH FINGER MOUNTING BRACKET

(71) Applicant: Panduit Corp., Tinley Park, IL (US)

(72) Inventor: Tomasz K. Waz, Orland Park, IL (US)

(73) Assignee: Panduit Corp., Tinley Park, IL (US)

( * ) Notice: Subject to any disclaimer, the term of this patent is extended or adjusted under 35 U.S.C. 154(b) by 440 days.

(21) Appl. No.: 18/121,061

(22) Filed: Mar. 14, 2023

(65) Prior Publication Data

US 2024/0314964 A1 Sep. 19, 2024

(51) Int. Cl.
*H05K 7/14* (2006.01)

(52) U.S. Cl.
CPC ......... *H05K 7/1489* (2013.01); *H05K 7/1491* (2013.01)

(58) Field of Classification Search
CPC ........................... H05K 7/1489; H05K 7/1491
USPC ................... 312/351, 265.1–265.4; 211/26.2
See application file for complete search history.

(56) References Cited

U.S. PATENT DOCUMENTS 5,921,402 A * 7/1999 Magenheimer ........ H04Q 1/023 211/94.01
6,190,081 B1 * 2/2001 Besserer .................. H02B 1/32 211/183
6,504,100 B2 * 1/2003 Lawrence .............. H02B 1/202 248/65
6,600,107 B1 * 7/2003 Wright ..................... H04Q 1/06 174/101
7,188,916 B2 * 3/2007 Silvestro ................ A47B 88/43 312/334.4
7,229,050 B2 * 6/2007 Schloss ................ H05K 7/1491 361/826
7,293,666 B2 11/2007 Mattlin et al.
7,398,949 B2 * 7/2008 Weech ................. H05K 7/1489 248/220.21
7,804,685 B2 9/2010 Krietzman
8,221,169 B2 * 7/2012 Ahmed .................... H04Q 1/06 361/826
8,787,023 B2 * 7/2014 Lewis, II ................ B25B 5/104 361/829
8,901,418 B2 * 12/2014 Walker ................. H05K 7/1491 211/26

(Continued)

FOREIGN PATENT DOCUMENTS

EP 2392146 A2 12/2011

OTHER PUBLICATIONS

American Power Conversion's NetShelter SX Air Recirculation Prevention Kit, Nov. 2005 (7 pgs.).

(Continued)

*Primary Examiner* — Daniel J Troy
*Assistant Examiner* — Timothy M Ayres
(74) *Attorney, Agent, or Firm* — Christopher K. Marlow; Christopher S. Clancy; James H. Williams

(57) ABSTRACT

An equipment rail mounted in a data center cabinet to support rack mounted equipment in the data center cabinet. The equipment rail includes a first section and a second section. A finger mounting bracket is secured to the second section of the equipment rail. The finger mounting bracket has a first member with sidewalls and a second member parallel to the first member. The distal ends of the sidewalls engage the equipment rail to form an open area between the first member and the second section of the equipment rail.

16 Claims, 9 Drawing Sheets

(56) References Cited

U.S. PATENT DOCUMENTS 9,581,782 B2 * 2/2017 Abby .................. B65H 75/446
9,642,270 B2 5/2017 Lewis, II et al.
9,814,159 B2 11/2017 Lewis, II et al.
9,980,400 B2 5/2018 Lewis, II et al.
10,178,784 B2 1/2019 Lewis, II et al.
10,182,651 B2 * 1/2019 Jost ........................ A47B 96/06
10,237,994 B2 3/2019 Donowho et al.
10,477,720 B2 11/2019 Hennrich et al.
10,492,605 B2 12/2019 Jost et al.
10,588,227 B2 3/2020 Donowho et al.
10,674,634 B2 6/2020 Lewis, II et al.
11,039,543 B2 6/2021 Donowho et al.
11,162,615 B2 11/2021 Hennrich et al.
11,346,466 B2 5/2022 Marcinkowski et al.
11,464,123 B2 10/2022 Garza et al.
11,502,488 B2 11/2022 Fariello et al.
11,598,132 B2 * 3/2023 Tsorng ...................... E05D 5/04
11,622,469 B2 * 4/2023 Waz ..................... H05K 7/1488 174/50
11,678,451 B2 * 6/2023 Nicewicz ............... H05K 5/023 312/244
12,035,501 B2 * 7/2024 Nicewicz ................. H05K 7/18
2007/0210680 A1 9/2007 Appino et al.
2012/0062091 A1 * 3/2012 Donowho ............ H05K 7/1491 312/351.1
2012/0063099 A1 * 3/2012 Alaniz ................ H05K 7/1447 277/650
2014/0153187 A1 * 6/2014 Liu ...................... H05K 7/1491 361/679.58
2021/0345501 A1 11/2021 Nicewicz et al.
2021/0345509 A1 11/2021 Marcus et al.
2021/0345516 A1 11/2021 Waz et al.

OTHER PUBLICATIONS

American Power Conversion's NetShelter SX Enclosure, Jan. 2008 (4 pgs.).

* cited by examiner 122
124
120
130
126
128
138
182
180
136
186
188
184

EQUIPMENT RAIL WITH FINGER MOUNTING BRACKET

FIELD OF THE INVENTION

The present invention relates to a data center cabinet, and more particularly to an equipment rail with a finger mounting bracket installed in a data center cabinet.

BACKGROUND OF THE INVENTION

In typical data center cabinets, equipment rails are installed within the cabinet for receiving rack mounted equipment. Equipment rails for wider cabinets, such as 800 mm, typically have additional structural features to help maintain adequate strength. As illustrated in FIGS. 1-4, a data center cabinet 20 includes a plurality of equipment rails 50. The equipment rails 50 include gussets 60 and a stiffening rib 62 that extends the length of the equipment rail 50. The gussets 60 and the stiffening rib 62 are welded in place to provide the equipment rails 50 with more rigidity when enduring horizontal forces in the front to back direction. As illustrated in FIG. 2, the equipment rails 50 include a plurality of diamond shaped openings 54 that are punched into the equipment rails 50. The diamond shaped openings 54 are designed to receive the cable management fingers 70 (FIG. 3). As illustrated in FIG. 2A, the stiffening rib 62 is welded to the back of the equipment rail 50. The stiffening rib 62 extends the full height of the equipment rail 50. A bulb seal 66 extending the full height of the equipment rail 50 is installed on the stiffening rib 62. The bulb seal 66 blocks the diamond shaped openings 54 that are not occupied with the cable management fingers 70. The bulb seal 66 is required to block unwanted air flowing through the diamond shaped openings 54 in the equipment rail 50 when the cable management fingers 70 are not required.

Thus, it is desirable to reduce the extra components of the equipment rail without impacting the vertical strength of the equipment rail. It is desirable to eliminate welding components to the equipment rail to reduce manufacturing costs. It is also desirable to eliminate the bulb seal used with the equipment rail to prevent unwanted air flowing through the equipment rail.

SUMMARY OF THE INVENTION

The present invention is directed to an equipment rail mounted in a data center cabinet. The equipment rail includes a first section and a second section. A finger mounting bracket is secured to the second section. The finger mounting bracket has a first member with sidewalls and a second member parallel to the first member. The distal ends of the sidewalls engage the equipment rail forming an open area between the first member and the equipment rail. The first member of the finger mounting bracket has a plurality of diamond openings for receiving a cable management accessory to route cables in the data center cabinet.

BRIEF DESCRIPTION OF THE DRAWINGS

FIG. 10 is an exploded front perspective view of the rack unit covers and the equipment rail of FIG. 5.

FIG. 11 is a front perspective view of the equipment rail of FIG. 5 with the rack unit covers installed on the equipment rail.

DETAILED DESCRIPTION

Figure 1:
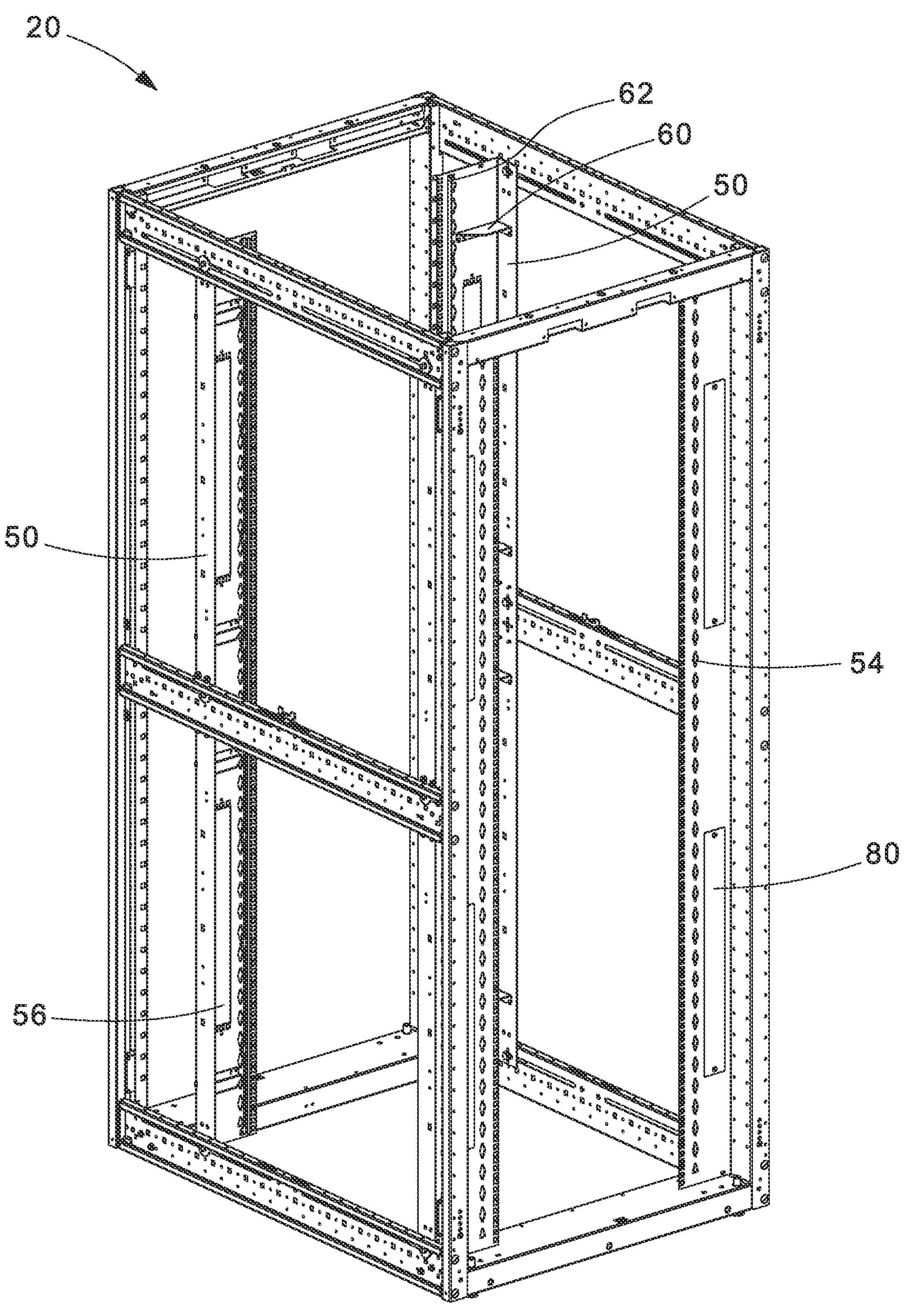
FIG. 1 is a perspective view of a prior art data center cabinet.
Figures 2, 2A:
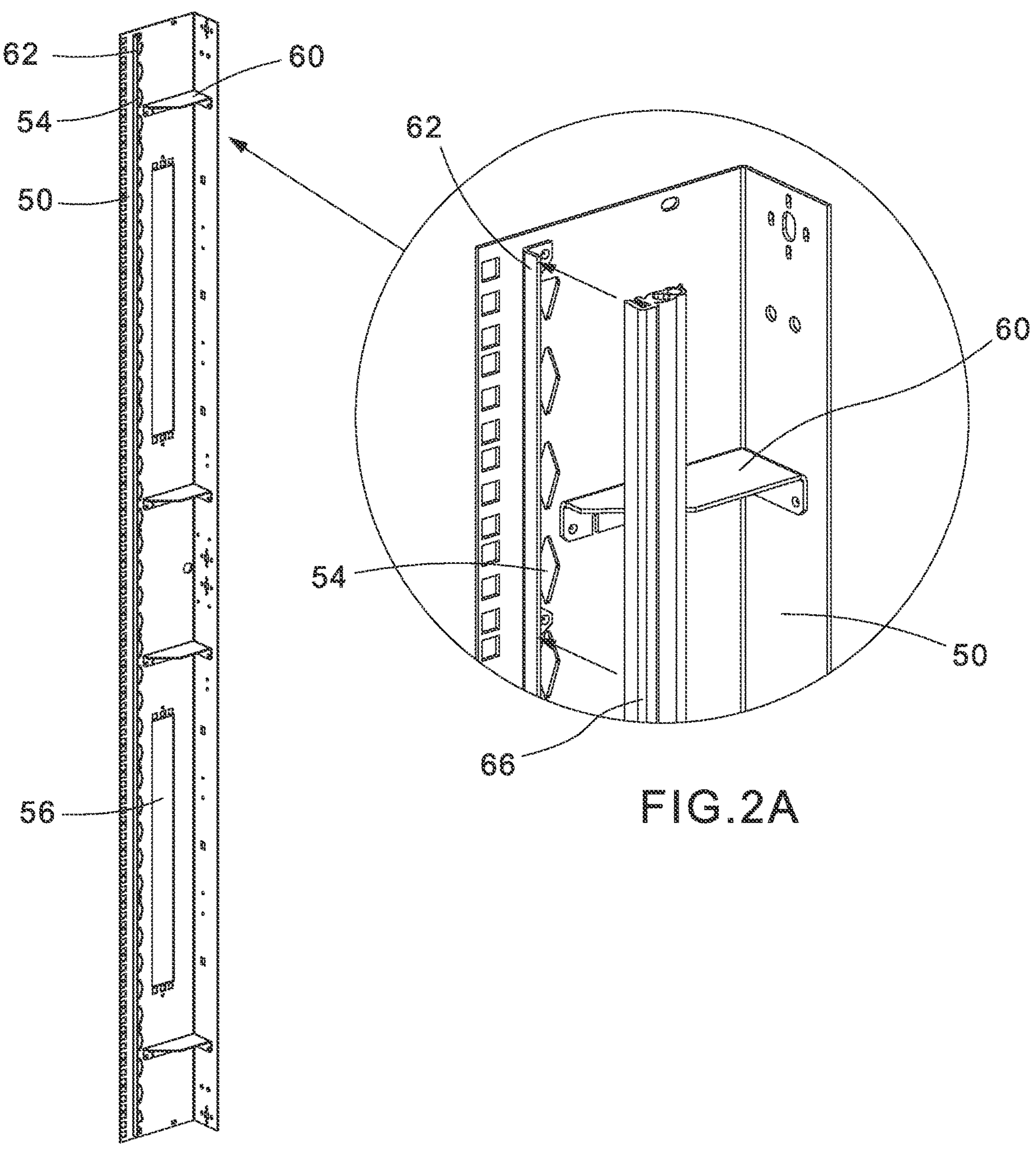
FIG. 2 is a rear perspective view of the prior art equipment rail installed in the data center cabinet of FIG. 1.
FIG. 2A is a partial perspective view of the prior art equipment rail of FIG. 2.
Figure 3:
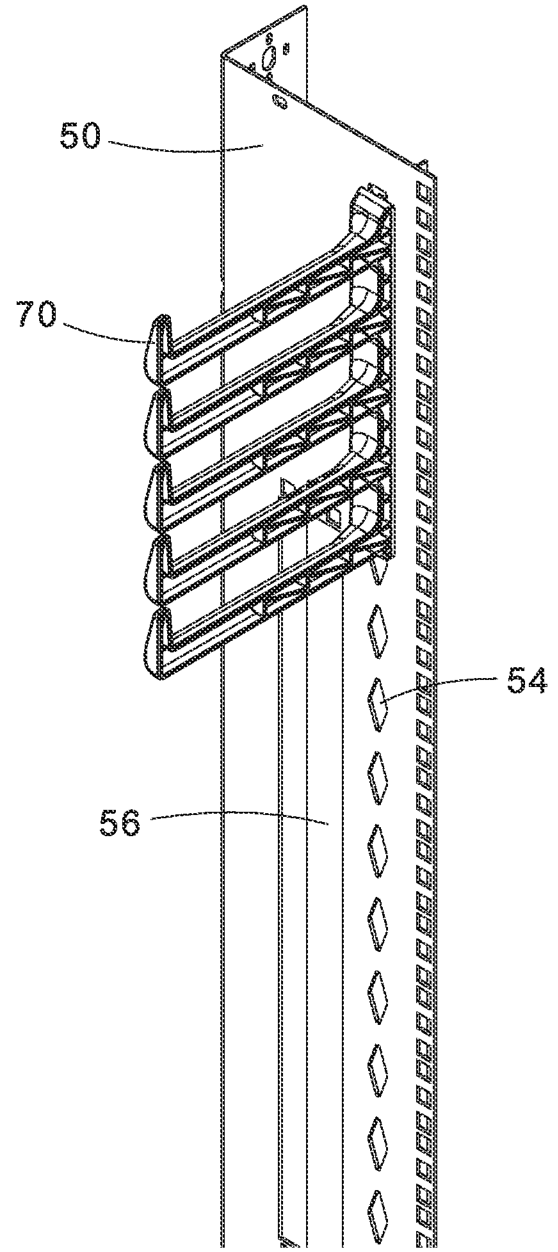
FIG. 3 is a front perspective view of the prior art equipment rail of FIG. 2 with cable management fingers installed in finger mount holes.
Figure 4:
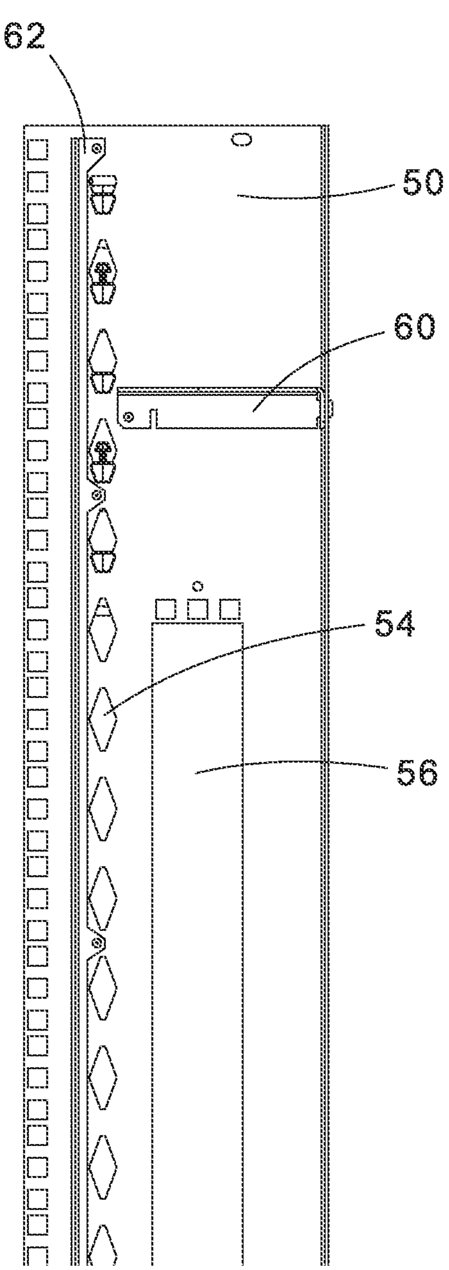
FIG. 4 is a rear view of the prior art equipment rail with the cable management fingers of FIG. 3 installed in finger mount holes.
Figure 5:
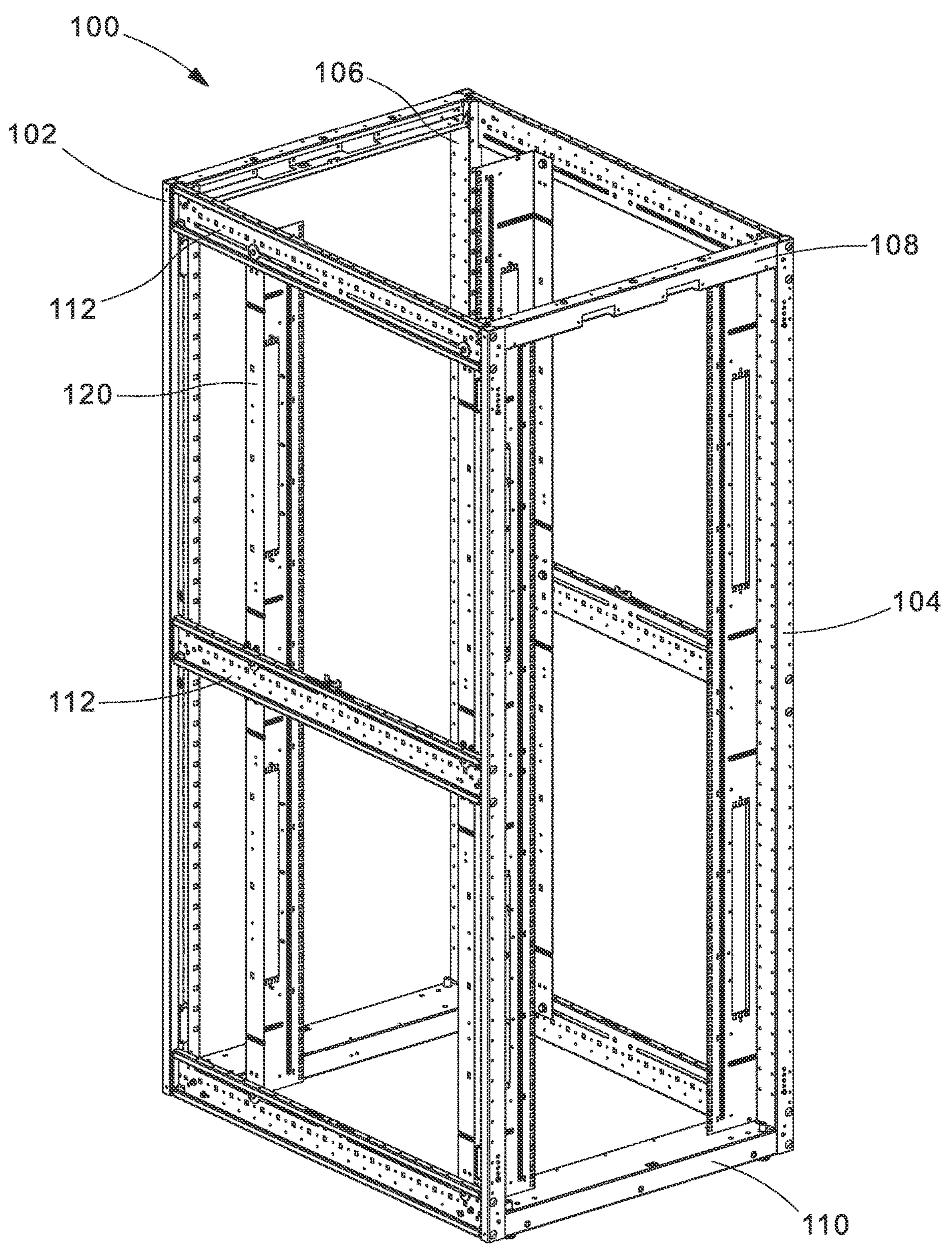
FIG. 5 is a perspective view of the data center cabinet with equipment rails of the present invention.

FIG. 5 illustrates a data center cabinet 100 with equipment rails 120. The data center cabinet 100 is defined by a frame 102 with two front vertical posts 104, two back vertical posts 106, top side to side beams 108, bottom side to side beams 110, and a plurality of front to back beams 112. The equipment rails 120 are installed at the front and back of the cabinet 100 and on each side of the cabinet 100. The equipment rails 120 are L-shaped with a first section 122 secured to the front to back beams 112 and a second section 124. The second section 124 includes a plurality of openings 126 extending the height of the equipment rail 120 for receiving the rack mounted equipment (not illustrated).

Figures 6, 6A:
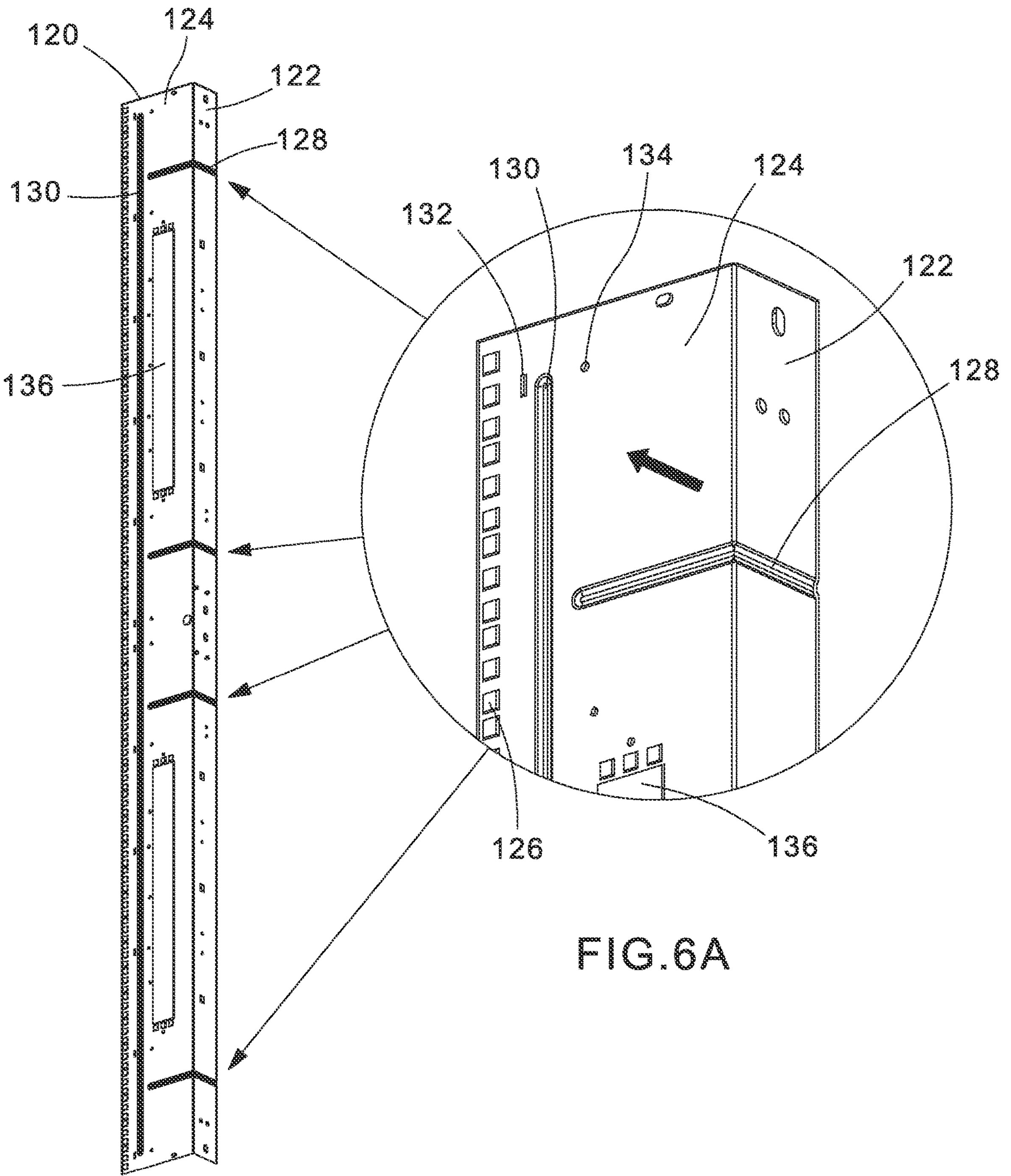
FIG. 6 is a rear perspective view of the equipment rail installed in the data center cabinet of FIG. 5.
FIG. 6A is a partial perspective view of the equipment rail of FIG. 6.

As illustrated in FIG. 6 and FIG. 6A, the equipment rail 120 includes a plurality of beads 128, 130 pressed into the equipment rail 120. The pressed in beads 128 extend horizontally in the first section 122 and the second section 124 of the equipment rail 120. The pressed in bead 130 extends vertically the full height of the equipment rail 120 in the second section 124.

The pressed in beads 128, 130 add rigidity to the equipment rail 150 when subject to horizontal forces in the front to back direction. The pressed in beads 128, 130 are an alternative to the welded gussets 60 in the prior art equipment rails 50 as illustrated in FIGS. 1-4. The pressed in beads 128, 130 eliminate the need for welding extra components to the equipment rail. The vertical pressed in bead 130 also eliminates the need for the stiffening rib 62 that was welded to the prior art equipment rails 50 illustrated in FIGS. 1-4.

Figure 7:
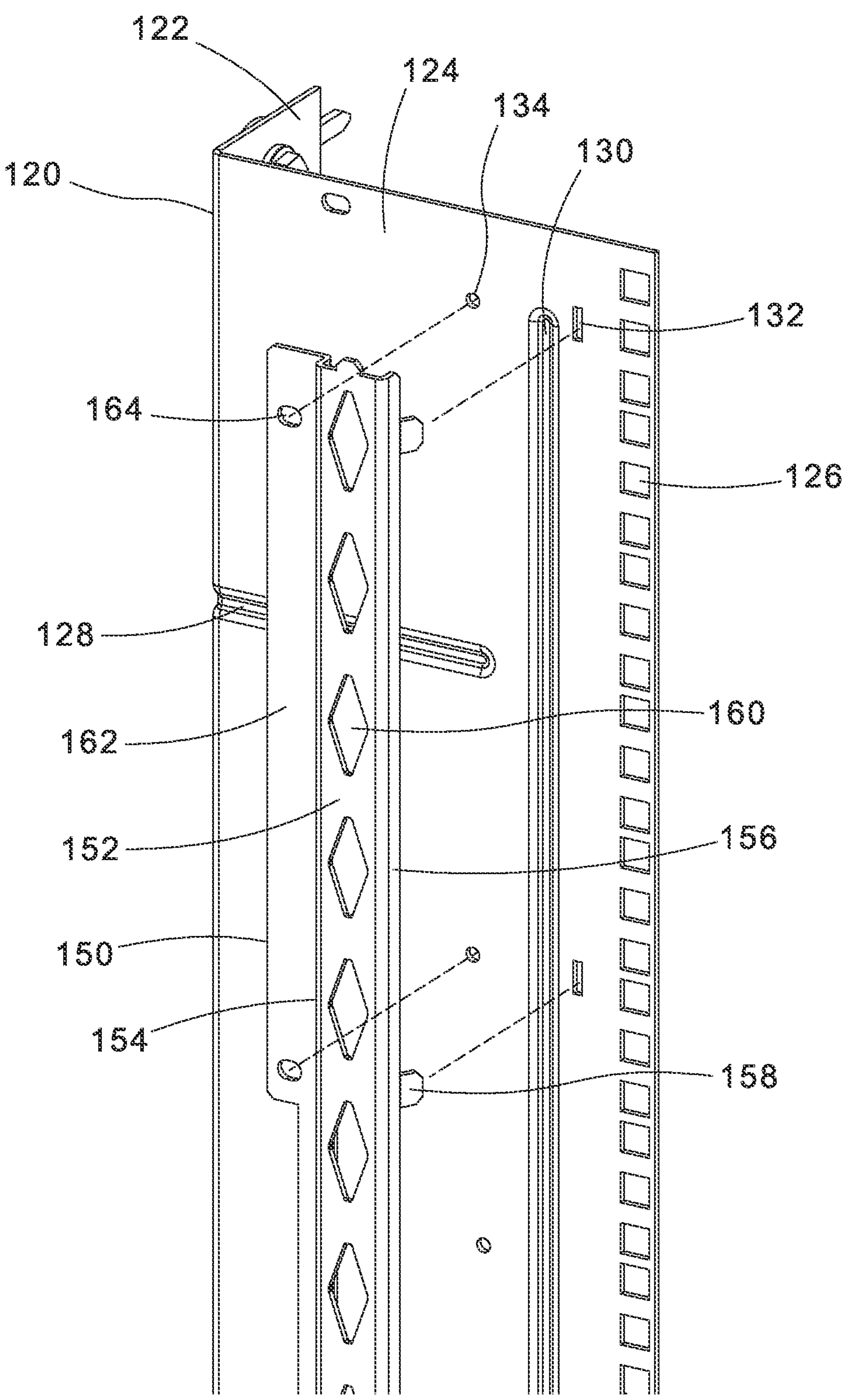
FIG. 7 is an exploded front perspective view of the equipment rail of FIG. 5 and a finger mounting bracket of the present invention.

As illustrated in FIG. 7, the equipment rail 120 includes a plurality of vertical slots 132 and screw hole openings 134. A finger mounting bracket 150 is positioned to be mounted to the equipment rail 120. The finger mounting bracket 150 is designed to receive cable management fingers 170 for routing cables. The finger mounting bracket 150 includes a first member 152 with sidewalls 154, 156 and a second member 162 parallel to the first member 152. The second member 162 extends from a distal end of one of the side walls 154. A plurality of hooks 158 extend from the distal end of the opposite side wall 156. The first member 152 includes a plurality of diamond shaped openings 160 for receiving cable management fingers 170, or other cable management accessory. The second member 162 includes a plurality of slots 164 for receiving fasteners to mount the finger mounting bracket 150 to the equipment rail 120.

Figure 8:
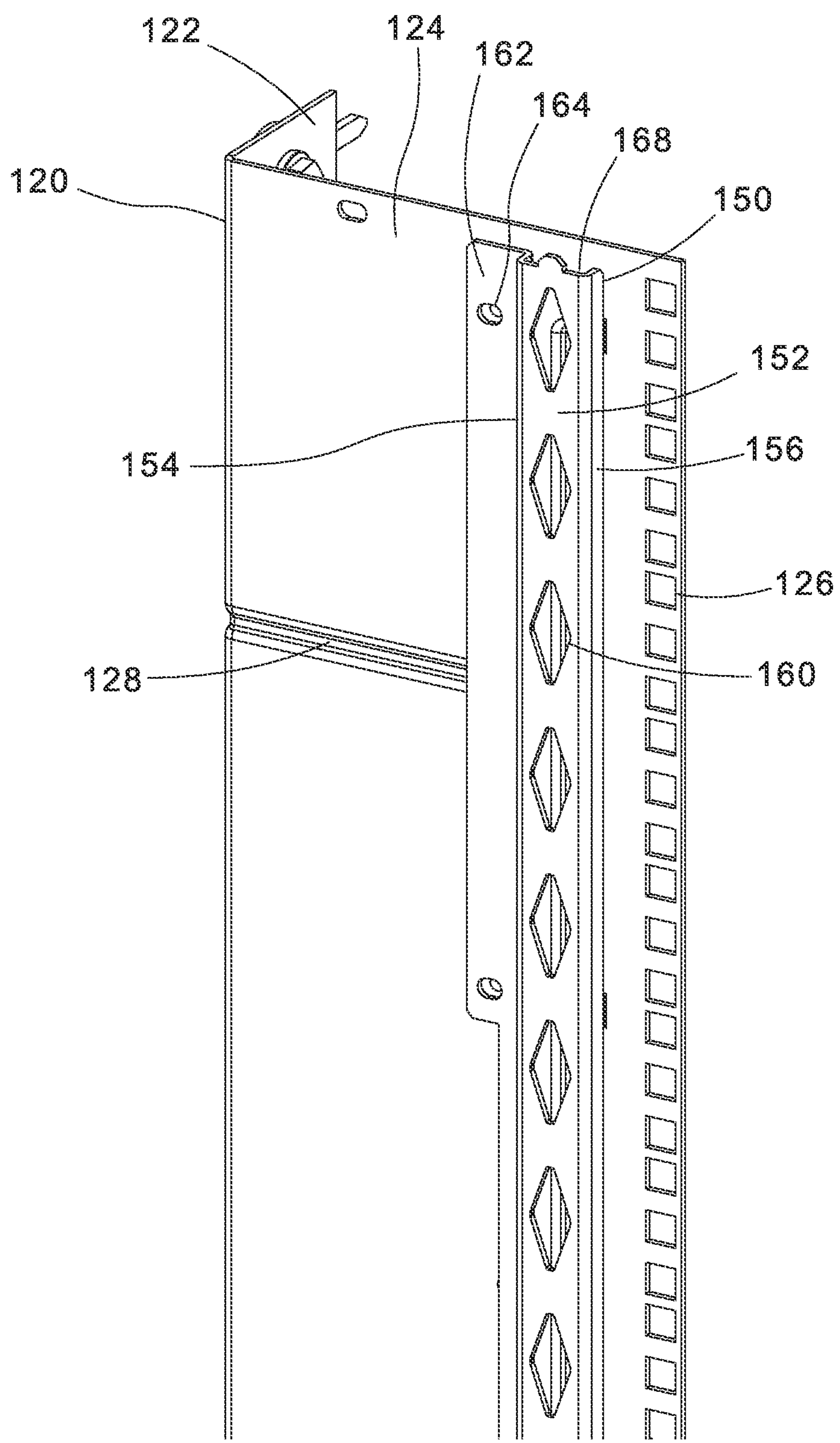
FIG. 8 is a front perspective view of the finger mounting bracket installed in the equipment rail of FIG. 5.
Figure 9:
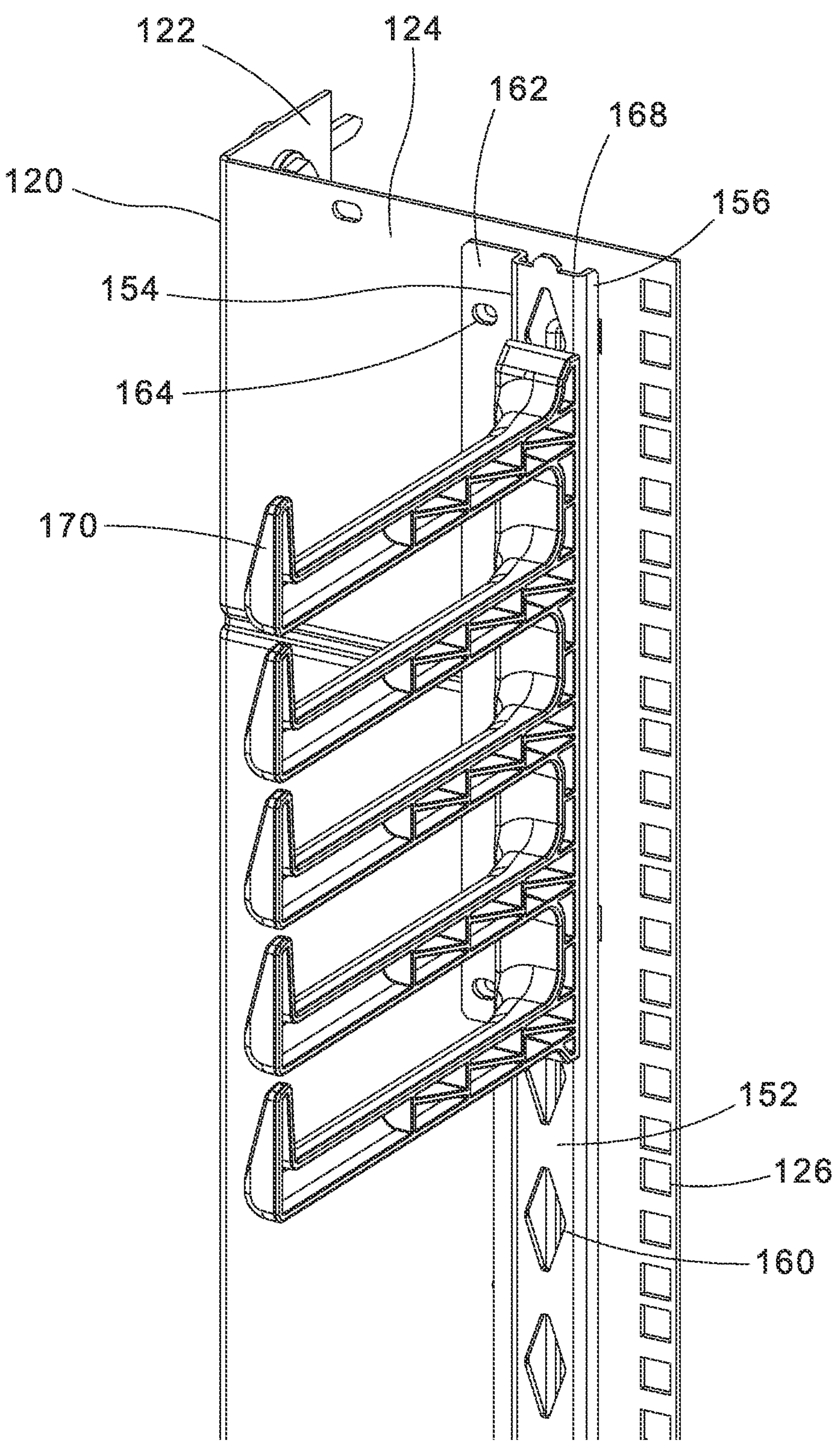
FIG. 9 is a front perspective view of cable management fingers installed in the finger mounting bracket of FIG. 8.

As illustrated in FIG. 7, the hooks 158 extending from the finger mounting bracket 150 align with the vertical slots 132 in the equipment rail 120. The slots 164 in the second member 162 align with the screw hole openings 134 in the equipment rail 120. As illustrated in FIG. 8, the hooks 158 extending from the finger mount bracket 150 are installed through the vertical slots 132 and the slots 164 and holes 134 are aligned to receive a screw (not illustrated), or other fastener, to secure the finger mounting bracket 150 to the equipment rail 120. The distal ends of the side walls 154, 156 extending from the first member 152 engage the equipment rail 120 forming an open area 168 between the first member 150 and the equipment rail 120. As illustrated in FIG. 9, cable management fingers 170 are mounted in the diamond shaped openings 160 with the mounting member on the back side of the cable management fingers 170 disposed within the diamond shaped opening 160 between the finger mounting bracket 150 and the equipment rail 120.

The diamond shaped openings 160 are blocked by the equipment rail 120 and the vertical bead pressed 130 into the equipment rail 120.

The equipment rail 120 of the present invention no longer includes the diamond shaped openings 54 for receiving the cable management fingers. As a result, removing the diamond shaped openings 54 eliminates the need for the bulb seal 66 used to block air potentially bypassed through the diamond shaped openings 54 in the prior art equipment rails 50 (see FIG. 2A).

Figures 10, 11:
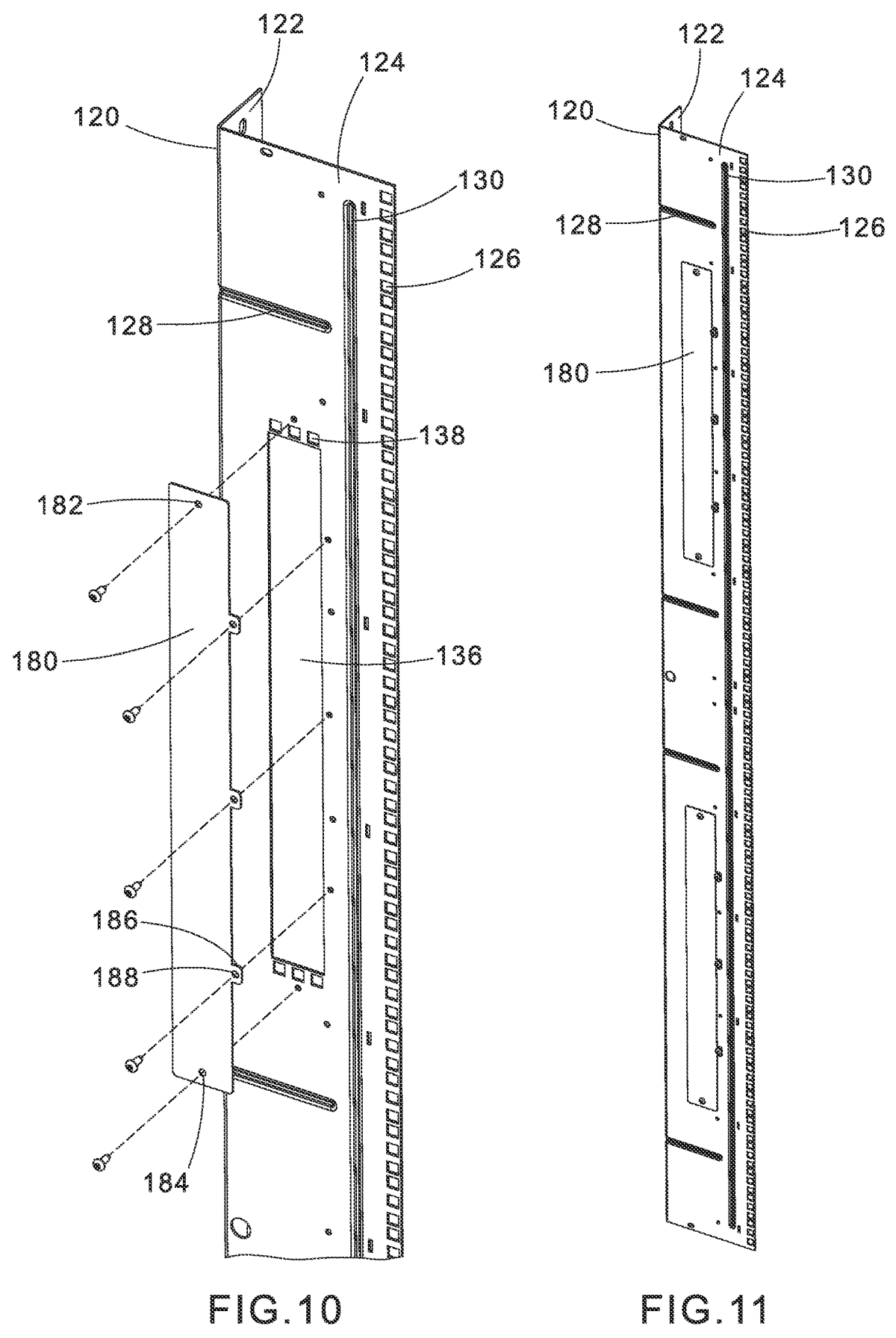

As illustrated in FIGS. 10 and 11, the equipment rail 120 also includes an improved rack unit cover 180. FIG. 10 illustrates the cover positioned to be installed on the equipment rail 120. FIG. 11 illustrates the covers 180 of the present invention secured over the 1 RU openings 136. It is common for equipment rails to include a vertical 1 RU (rack unit) opening 136 within the equipment rail 120. The 1 RU openings 136 are designed for receiving pieces of equipment or patch panels that are compatible with the 1 RU openings 136 per EIA/ECA-301-E standards. When the 1 RU openings 136 are not in use, they are covered with metal plates 180 to block air flow. As illustrated in the prior art cabinet of FIG. 1, the covers 80 are only mounted to the equipment rail 50 at the top and bottom of the equipment rail 50. The covers 180 of the present invention include side tabs 186 with fastener openings 188 in addition to the fastener openings 182, 184 at the top and the bottom, respectively, of the cover 180. The side tabs 186 with fastener openings 188 add rigidity to the 1 RU openings 136 in the equipment rail 120 when the cover 180 is installed on the equipment rail 120. Thus, the additional tabs 186 and fasteners provide additional structural support for the equipment rails 120 at the 1 RU openings 136.

Furthermore, while the particular preferred embodiments of the present invention have been shown and described, it will be obvious to those skilled in the art that changes and modifications may be made without departing from the teaching of the invention. The matter set forth in the foregoing description and accompanying drawings is offered by way of illustration only and not as limitation. The actual scope of the invention is intended to be defined in the following claims when viewed in their proper perspective based on the prior art.

What is claimed is:

1. An equipment rail mounted in a data center cabinet, the equipment rail comprising:

a first section and a second section; and a finger mounting bracket secured to the second section, wherein the finger mounting bracket has a first member with sidewalls extending in a same direction and a second member parallel to the first member, wherein distal ends of the sidewalls engage the equipment rail forming an open area between the first member and the equipment rail such as to be framed by the equipment rail on a first side, a center section of the first member on a second side opposite the first side, and the sidewalls of the first member connecting the first side to the second side on opposite ends of the first side and the second side wherein the second section includes a plurality of vertical slots and fastener openings, the second member of the finger mounting bracket extends from a distal end of one of the sidewalls of the first member, a plurality of hooks extend from a distal end of opposite side wall of the first member, whereby the hooks are installed in the vertical slots in the equipment rail to secure the finger mounting bracket to the equipment rail.

2. The equipment rail of claim 1, wherein the second section of the equipment rail includes a plurality of openings extending a height of the equipment rail for receiving rack mounted equipment.

3. The equipment rail of claim 1, wherein a plurality of beads are pressed into the equipment rail for adding rigidity to the equipment rails.

4. The equipment rail of claim 3, wherein the plurality of beads include horizontal beads that extend in the first section and the second section.

5. The equipment rail of claim 3, wherein the plurality of beads include a vertical bead extending a length of the equipment rail.

6. The equipment rail of claim 1, wherein the second member of the finger mounting brackets has a plurality of slots for receiving fasteners to mount the finger mounting bracket at the fastener openings in the equipment rail.

7. The equipment rail of claim 1, the first member of the finger mounting bracket has a plurality of diamond openings for receiving a cable management accessory.

8. The equipment rail of claim 1, further comprising rack unit openings adapted to receive equipment, and rack unit covers positioned to block the rack unit openings, wherein the rack unit covers have a plurality of side tabs with fastener openings.

9. A data center cabinet comprising:

a frame including front vertical posts, a first bottom side to side beam and a first top side to side beam positioned between and connected to the front vertical posts, back vertical posts, a second bottom side to side beam and a second top side to side beam positioned between and connected to the back vertical posts, a plurality of front to back beams positioned between and connected to one of the front vertical posts and one of the back vertical posts;

equipment rails secured to the plurality of front to back beams, wherein each equipment rail has a first section and a second section; and a finger mounting bracket secured to one of the equipment rails, wherein the finger mounting bracket has a first member with sidewalls and a second member parallel to the first member extending in a same direction, wherein distal ends of the sidewalls engage the equipment rail forming an open area between the first member and the equipment rail such as to be framed by the equipment rail on a first side, a center section of the first member on a second side opposite the first side, and the sidewalls of the first member connecting the first side to the second side on opposite ends of the first side and the second side, wherein the second section includes a plurality of vertical slots and fastener openings, the second member of the finger mounting bracket extends from a distal end of one of the sidewalls of the first member, a plurality of hooks extend from a distal end of opposite side wall of the first member, whereby the hooks are installed in the vertical slots in the equipment rail to secure the finger mounting bracket to the equipment rail.

10. The data center cabinet of claim 9, wherein the equipment rails are positioned at a front and back of the cabinet on each side of the cabinet.

11. The data center cabinet of claim 9, wherein the second section of each equipment rail includes a plurality of openings extending a height of the equipment rail for receiving rack mounted equipment.

12. The data center cabinet of claim 9, wherein the equipment rails include a plurality of beads pressed into the equipment rails for adding rigidity to the equipment rails.

13. The data center cabinet of claim 12, wherein the plurality of beads include horizontal beads that extend in the first section and the second section and a vertical bead extending a length of the equipment rail.

14. The data center cabinet of claim 9, the second member of the finger mounting brackets has a plurality of slots for receiving fasteners to mount the finger mounting bracket to the equipment rail.

15. The data center cabinet of claim 9, the first member of the finger mounting bracket has a plurality of diamond openings for receiving a cable management accessory.

16. The data center cabinet of claim 9, wherein the equipment rails include rack unit openings adapted to receive equipment, and rack unit covers positioned to block the rack unit openings, wherein the rack unit covers have a plurality of side tabs with fastener openings.

* * * * *